(12) United States Patent
Dvorsky et al.

(10) Patent No.: US 12,212,272 B2
(45) Date of Patent: Jan. 28, 2025

(54) GENSET CONTROL SYSTEM USING A MODIFIED ROOT-MEAN-SQUARE CURRENT MEASUREMENT

(71) Applicant: CATERPILLAR INC., Peoria, IL (US)

(72) Inventors: Michael A. Dvorsky, Hanna City, IL (US); Stephen C. Nofsinger, Washington, IL (US)

(73) Assignee: CATERPILLAR INC., Peoria, IL (US)

( * ) Notice: Subject to any disclaimer, the term of this patent is extended or adjusted under 35 U.S.C. 154(b) by 140 days.

(21) Appl. No.: 18/152,372

(22) Filed: Jan. 10, 2023

(65) Prior Publication Data
US 2024/0235443 A1    Jul. 11, 2024

(51) Int. Cl.
*H02P 9/02* (2006.01)
*G01R 19/02* (2006.01)

(52) U.S. Cl.
CPC .............. *H02P 9/02* (2013.01); *G01R 19/02* (2013.01)

(58) Field of Classification Search
CPC .................................. H02P 9/02; G01R 19/02
See application file for complete search history.

(56) References Cited

U.S. PATENT DOCUMENTS

| | | |
|---|---|---|
| 4,685,024 A | 8/1987 | Martellock et al. |
| 5,237,511 A | 8/1993 | Caird et al. |
| 6,040,689 A | 3/2000 | Gluszek |
| 6,072,310 A | 6/2000 | Krebs et al. |
| 6,247,003 B1 | 6/2001 | Cummins et al. |
| 2011/0210715 A1 | 9/2011 | Kim et al. |
| 2021/0231723 A1 | 7/2021 | Hao |
| 2024/0275261 A1* | 8/2024 | Jiménez Giménez et al. ............... H02M 3/1582 |

FOREIGN PATENT DOCUMENTS

| | | |
|---|---|---|
| CN | 106842099 A | 6/2017 |
| CN | 106990381 A | 7/2017 |
| CN | 113985289 B | 1/2022 |
| EP | 2747229 B1 | 11/2017 |
| IN | 399382 B | 1/2021 |
| WO | 2009027373 A2 | 3/2009 |

* cited by examiner

*Primary Examiner* — Jeffrey M Shin

(57) ABSTRACT

A method of operating a generator set is disclosed. The method includes generating a current using a generator set, and stepping down the generated current to a stepped down current, using an internal current transformer. The method includes measuring the stepped down current using a current meter that may generate a current signal representative of the stepped down current. Further, the method includes generating a root-mean-square (RMS) value using a plurality of current values associated with the current signal. The method also includes generating a modified RMS value, using the current values that are greater than a predetermined current value. The method includes determining a measured value of the current generated by the generator set based on the RMS value and the modified RMS value. In addition, the method includes adjusting an operation of the generator set when the measured value exceeds an overcurrent threshold.

20 Claims, 9 Drawing Sheets

| SEGMENT | CORRECTION FACTOR |
|---|---|
| $I_{THRESHOLD2} - I_1$ | $A_1 (m_{01}, I_{THRESHOLD2})$ |
| $I_1 - I_2$ | $A_2 (m_{12}, I_1)$ |
| $I_2 - I_3$ | $A_3 (m_{13}, I_2)$ |
| $I_3 - I_4$ | $A_4 (m_{34}, I_3)$ |
| $I_4 - I_5$ | $A_5 (m_{45}, I_4)$ |
| $I_5 - I_6$ | $A_6 (m_{56}, I_5)$ |
| $I_6 - I_{THRESHOLD3}$ | $A_7 (m_{67}, I_6)$ |

*FIG. 6A*

GENSET CONTROL SYSTEM USING A MODIFIED ROOT-MEAN-SQUARE CURRENT MEASUREMENT

TECHNICAL FIELD

The present disclosure relates generally to a genset control system, and more particularly, to a genset control system using a modified root-mean-square (RMS) current measurement.

BACKGROUND

Industrial generator sets (or gensets) may generate several tens to thousands of amperes of current at frequencies of 50 Hz or 60 Hz. Typically, a current transformer (CT) is used to step down these high current values to current values that can be read by commonly used current meters for measuring the current generated by the genset. The current transformer is generally external to the current meter and is configured to step down the current values to a nominal range of 1 A (1 ampere) or 5 A depending on the configuration of the genset. The nominal range of 1 A may include current values ranging between 0 A to 5 A and the 5 A nominal range may include current values ranging between 5 A and 20 A. The current meter typically includes an additional internal current transformer that further steps down the nominal current values to internal current values of the order of a few milli-amperes. This internal current is then measured by the current meter. The current meter also determines the current being generated by the genset based on that measurement.

In certain industrial applications, there may be a system requirement to measure currents that may far exceed the maximum rated current for an industrial genset or for an associated current transformer. Such high currents (over-currents) may occur, for example, due to a fault in the electrical circuit such as a short-circuit, or some other malfunction that may cause the current flowing through the circuit to increase well over the maximum rated current. In such situations the stepped down current provided by the external current transformer also exceeds the nominal ranges described above. When such an over-current is supplied to a current meter, the ferrite core of the internal current transformer in the current meter may saturate and as a result the internal current transformer may output a zero or near zero stepped down current. Because the current meter determines the current being generated by the genset by measuring the stepped down current received from the internal current transformer, saturation of the ferrite core of the internal current transformer may lead to inaccurate measurements by the current meter. As a result, it may be difficult to take remedial actions to prevent damage to the genset and/or to the electrical circuit connected to the genset based on the inaccurate measurements by the current meter.

Conventional solutions to the above problem include using additional and/or higher capacity current transformers that may be capable of stepping down the over-currents generated in the circuit without saturation of the transformer core. Using additional current transformers and/or using higher capacity current transformers to prevent core saturation, however, undesirably increases the cost and may also increase a size of the overall generator and control system and/or the current meter. Accordingly, there is a need for a system and a method for detecting the high currents that may occur during an over-current condition to be able to timely take remedial action to prevent damage to the genset and/or to the electrical circuit connected to the genset.

U.S. Pat. No. 6,072,310 of Krebs et al. issued on Jun. 6, 2000 ("the '310 patent") and discloses a method and a device for detecting and correcting a saturated current profile of a current transformer. The '310 patent discloses using sampled values of the current profile to detect a start of saturation and an end of saturation based on pattern recognition. Further, the '310 patent discloses that an image of the unsaturated current signal profile is reconstructed based on the detected start and end of saturation, and based on sampled values of the non-saturated signal. The reconstructed current signal profile is used to determine a measured value of the current flowing in a circuit.

Although the '310 patent discloses a method of correcting the saturated current profile, the disclosed method may be sub-optimal. For example, the disclosed method relies on pattern recognition based on typical current saturation profiles to detect the start and end of saturation. The actual current profiles of the current generated by a genset, however, may differ from typical current profiles, making the disclosed pattern recognition technique sub-optimal for identifying the start and end of saturation. Further, the disclosed method of the '310 patent relies on regeneration of an unsaturated current profile, which may require additional computation time and may additionally or alternatively also require additional memory for storage of the regenerated profile, both of which may be undesirable.

The system and method of the present disclosure solve one or more of the problems set forth above and/or other problems of the prior art.

SUMMARY

In one aspect, the present disclosure is directed to a method of operating a generator set. The method may include generating a current using a generator set. The method may also include stepping down the generated current to a stepped down current, using an internal current transformer. Further, the method may include measuring the stepped down current using a current meter. The current meter may be configured to generate a current signal representative of the stepped down current. The method may include generating, using a controller, a root-mean-square (RMS) value using a plurality of current values associated with the current signal. The method may also include generating, using the controller, a modified RMS value, using current values, selected from the plurality of current values, and greater than a predetermined value. Further, the method may include determining, using the controller, a measured value of the current generated by the generator set based on the RMS value and the modified RMS value. In addition, the method may include adjusting, using the controller, an operation of the generator set when the measured value exceeds an over-current threshold.

In another aspect, the present disclosure is directed to system for controlling operation of a generator set. The system may include at least one current transformer configured to step down current, generated by the generator set, to a stepped down current. Further, the system may include a current meter configured to generate a current signal representative of the stepped down current. The system may also include a controller. The controller may be configured to determine a root-mean-square (RMS) value of a plurality of current values associated with the current signal. When the RMS value is greater than a transformer current threshold, the controller may be configured to determine a modified RMS value of current values, selected from the plurality of current values, and greater than a predetermined value, and determine a measured value of the current generated by the generator set based on the modified RMS value. When the RMS value is less than or equal to the transformer current threshold, the controller may be configured to determine the measured value of the current generated by the generator set based on the RMS value. The controller may also be configured to adjust an operation of the generator set when the measured value exceeds an over-current threshold.

BRIEF DESCRIPTION OF THE DRAWINGS

FIG. 6A is a table illustrating exemplary correction factors that may be used to correct the measured current;

DETAILED DESCRIPTION

Figure 1:
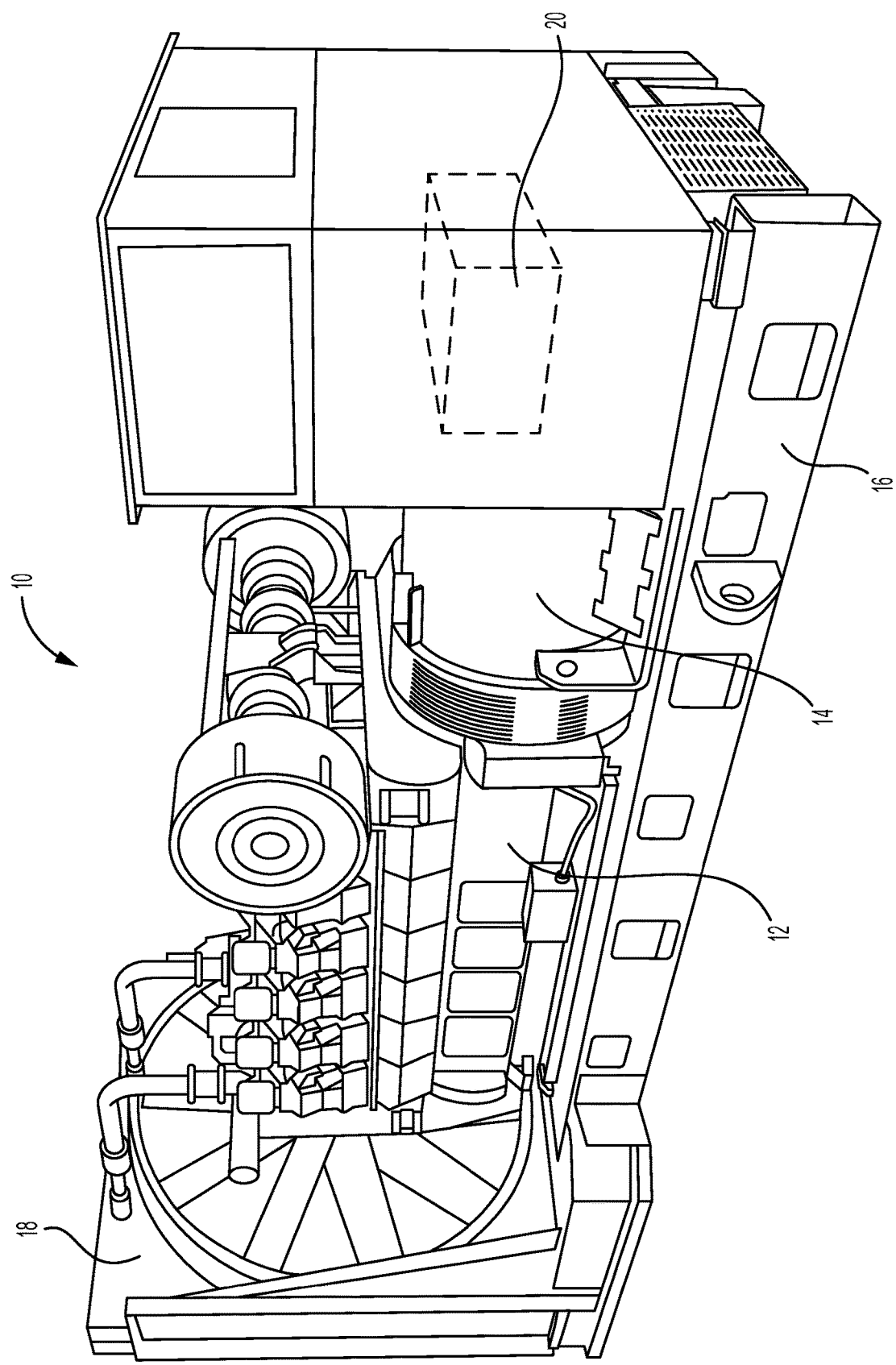
FIG. 1 is a pictorial illustration of an exemplary disclosed genset.

FIG. 1 illustrates an exemplary generator set 10 (or genset 10). Genset 10 may be configured to provide electrical power to any number of electrically-power devices. For example, genset 10 may be configured to provide electrical power to electrical devices at a worksite where utility power is unavailable, and/or during temporary power outages. Genset 10 may provide AC (alternating current) or DC (direct current) power. Genset 10 may include engine 12 and generator 14 supported by base 16.

Engine 12 may be configured to drive generator 14. Engine 12 may be any suitable type of internal combustion engine, such as a gasoline, diesel, natural gas, or hybrid-powered engine. Engine 12 may include a plurality of combustion chambers that may be disposed in an in-line configuration, a V-shaped configuration, or any other suitable configuration. Engine 12 may be configured to combust fuel in the combustion chambers to generate a rotary motion of a crankshaft (not shown) associated with engine 12. As also illustrated in FIG. 1, engine 12 may include a cooling system 18 that may include a radiator and/or a cooling fan to cool engine 12 and/or generator 14.

A crankshaft (not shown) of engine 12 may be configured to rotate one or more components of generator 14. For example, generator 14 may include a rotor (not shown) that may rotate relative to a stator (not shown). The crankshaft of engine 12 may be configured to rotate the rotor relative to the stator. The rotor and stator may each include a set of electrical coils. As the rotor rotates, an AC current may be induced in the coils of the stator. The AC current may be directed out of generator 14 via one or more terminals (not shown). Generator 14 may be connected to one or more electrical devices (or loads) such that current generated by generator 14 may flow through the electrical devices via an electrical circuit. In some exemplary embodiments, genera-tor 14 may also include a genset controller 20 configured to control operations of engine 12 and/or generator 14.

Figure 2:
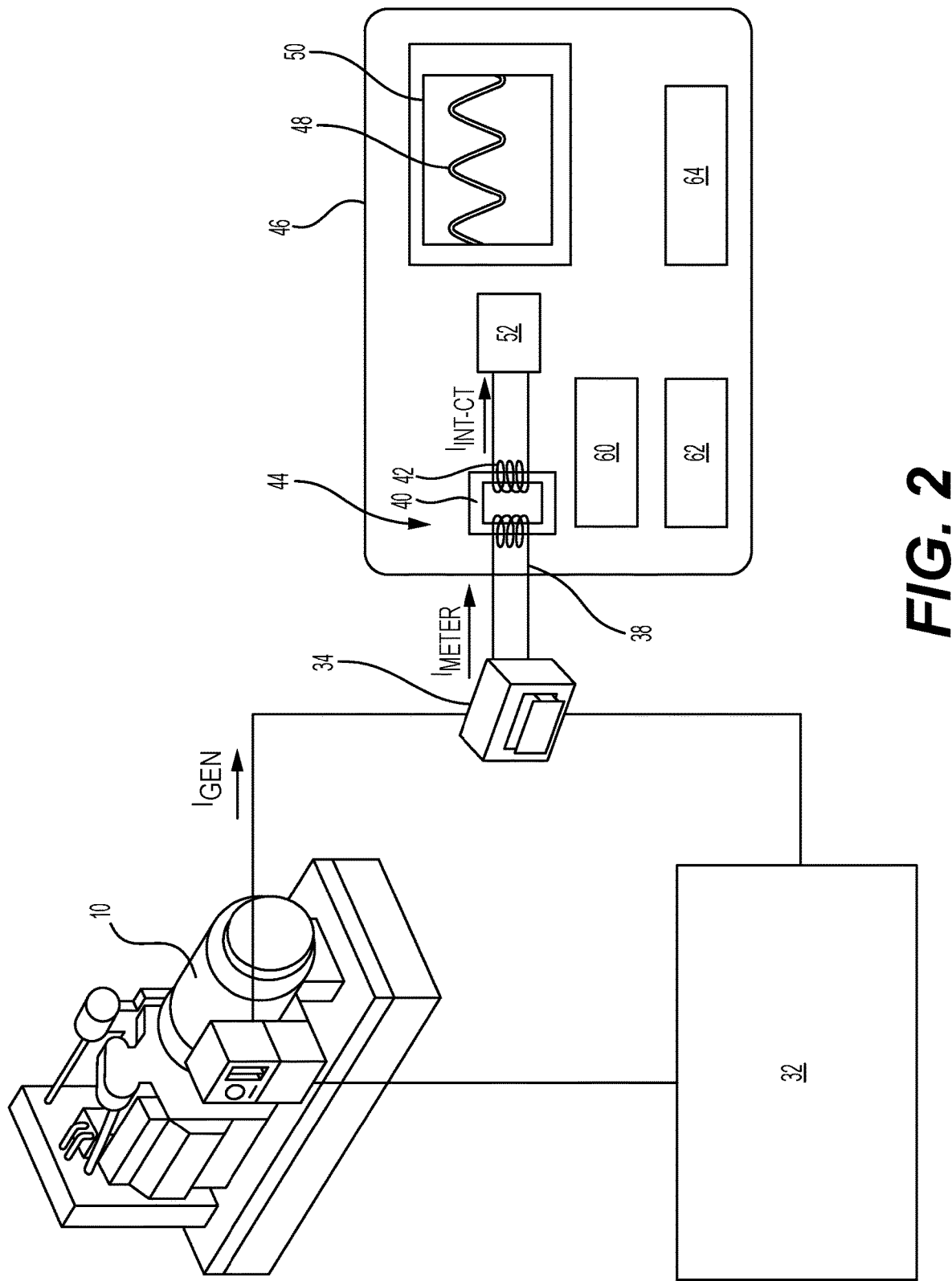
FIG. 2 is an illustration of an exemplary system for controlling the operation of the genset of FIG. 1.

FIG. 2 illustrates an exemplary system 30 for controlling operation of genset 10. As illustrated in FIG. 2, genset 10 may be connected to an electrical device or load 32. As also illustrated in FIG. 2, genset 10 may be connected to load 32 via external transformer 34. System 30 may also include current meter 36 configured to measure the current, $I_{GEN}$, being generated by genset 10. It is to be understood that system 30 may include one or more additional electrical devices or components (e.g., electrical filters, capacitors, inductors, transformers, relays, or resistors), and/or one or more additional loads 32 that have been omitted from FIG. 2.

External transformer 34 may be a current transformer configured to receive current $I_{GEN}$ generated by genset 10. External transformer 34 may be configured to step down (e.g., reduce the magnitude of) the received current $I_{GEN}$ to a stepped down current $I_{METER}$ of a smaller value (e.g., in the nominal range of 1 A to 5 A), which in turn may be supplied to current meter 36. In some exemplary embodiments, external transformer 34 may be configured to step down the current received from the generator by a transformer ratio of 400:5 such that an $I_{GEN}$ of 400 A may be stepped down to an $I_{METER}$ of 5 A. It is to be understood that the transformer ratio 400:5 is exemplary and non-limiting and that external transformer 34 may be configured to step down the current received from the generator by any transformer ratio (e.g., 400:1, 1000:1, 1000:5, 4000:1, 4000:5, or any other ratio). In some exemplary embodiments, external transformer 34 may be configured to provide a current $I_{METER}$ in the nominal range of 1 A (the range being 0 A to 1 A) or 5 A (the range being 0 A to 5 A), although other nominal ranges are also contemplated.

Current meter 36 may be configured to measure the stepped down current $I_{METER}$ received from external current transformer 34. As illustrated in FIG. 2, current meter 36 may include one or more internal current transformers 44 that may be configured to further reduce or step down the current $I_{METER}$ received from external transformer 34. For example, internal current transformer 44 may be configured to step down current $I_{METER}$ in the nominal range of 5 A to a further stepped down current $I_{INT-CT}$ having a nominal range of a few milli-amperes. In one exemplary embodiment, internal current transformer 44 may include primary winding 38, core 40, and secondary winding 42. An alternating current, for example, $I_{METER}$ passing through primary winding 38 may produce an alternating magnetic field in core 40, which may induce an alternating current, $I_{INT-CT}$, in secondary winding 42. Internal current transformers 44 may be smaller in size as compared to external current transformers 34 and may be accommodated within housing 46 of current meter 36. It is contemplated that external current transformers 34 may have a structure (including a core and primary and secondary windings) similar to a structure of internal current transformers 44 described above.

Current meter 36 may include one or more analog-to-digital converters 52 that may receive the stepped down current $I_{INT-CT}$ from internal current transformer 44 and generate a plurality of current values that may represent a current signal 48 corresponding to the stepped down current $I_{INT-CT}$. Current meter 36 may be configured to generate current signal 48 representative of a stepped down current $I_{INT-CT}$ (stepped down by internal transformer 44) flowing through current meter 36. As illustrated in FIG. 2, an AC current generated by generator 14 may be represented by a generally sinusoidal current signal 48 as displayed by display screen 50 of current meter 36. Although display screen 50 has been illustrated as displaying a waveform corresponding to current signal 48, it is contemplated that in some exemplary embodiments, display screen 50 may be configured to display numerical values of the measured current, a measured voltage, a measured power, or a measured power factor.

Current meter 36 may also include controller 60 that may be configured to control one or more operations of one or more components of current meter 36 and/or may be configured to transmit one or more control signals to genset controller 20. Controllers 20 and 60 each may include or be associated with one or more processors, memory devices 62, and/or communication devices 64. Controllers 20 and 60 each may embody a single microprocessor or multiple microprocessors, digital signal processors (DSPs), application-specific integrated circuit devices (ASICs), etc. Numerous commercially available microprocessors may be configured to perform the functions of Controllers 20 and 60. Various other known circuits may be associated with Controllers 20 and 60, including power supply circuits, signal-conditioning circuits, and/or communication circuits, etc.

Controllers 20 and 60 each may be associated with one or more memory devices 62. The one or more memory devices 62 associated with controllers 20 and 60 may store, for example, data and/or one or more control routines, instructions, mathematical models, algorithms, machine learning models, etc. The one or more memory devices 62 may embody non-transitory computer-readable media, for example, Random Access Memory (RAM) devices, NOR or NAND flash memory devices, and Read Only Memory (ROM) devices, CD-ROMs, hard disks, floppy drives, optical media, solid state storage media, etc. Controllers 20 and 60 may execute one or more routines, instructions, mathematical models, algorithms, and/or machine learning models stored in one or more memory devices 62 to generate and deliver one or more control signals to one or more components of current meter 36 and/or to one or more components of or genset controller 20 associated with genset 10.

Communication device 64 of current meter 36 may be configured to wirelessly send or receive data and/or instructions. Communication device 64 may include hardware and/or software that enable the sending and/or receiving of data messages through a communications link. The communications link may include a wired link, or a wireless communication link such as satellite, cellular, infrared, radio, or other wireless link. Communication device 64 may allow controller 60 to exchange data and/or control signals with genset controller 20 of genset 10.

As discussed above, current meter 36 may generate current signal 48 representative of the current $I_{METER}$ received, for example, from external current transformer 34, and the stepped down current $I_{INT-CT}$ received, for example, from internal current transformer 44. Controller 60 may be configured to control an analog-to-digital converter associated with current meter 36 to periodically sample the current signal 48 to generate a plurality of current values associated with current signal 48. In some embodiments, the sampling frequency or the number of current values generated per unit time may be variable. For example, the sampling frequency may be of the order of 12,800 Hz (Hertz) for a 50 Hz AC current or 15,360 Hz for a 60 Hz AC current, or any other desired frequency. The sampling frequency may be selected to ensure obtaining at least 256 samples of current values per cycle of the alternating current waveform. The sampling frequency may be adjusted while making measurements, and may be correlated with the measured AC frequency. For example, the sampling frequency may be continuously adjusted to maintain 256 samples per AC cycle.

Figure 3:
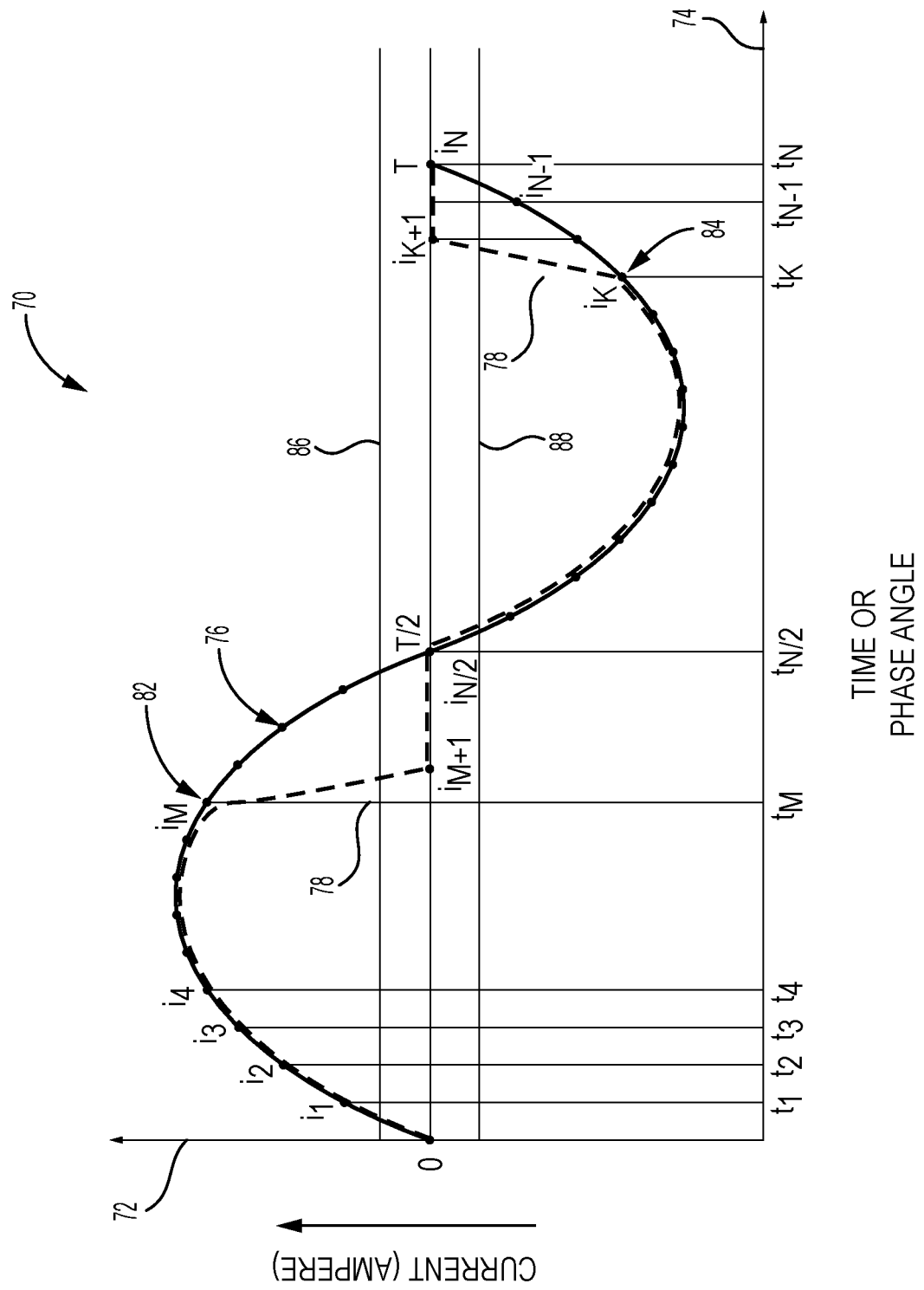
FIG. 3 is an exemplary graph illustrating a current signal representative of the current generated by the genset of FIG. 1.

FIG. 3 illustrates a graph 70 showing an exemplary variation of current signal 48 generated by current meter 36. The ordinate or y-axis 72 in graph 70 may represent a magnitude of the current signal, which in turn may be representative of a magnitude of the current $I_{GEN}$ generated by genset 10. The abscissa or x-axis 74 in graph 70 may represent a phase angle or time associated with the stepped down currents $I_{METER}$, $I_{INT-CT}$, or the current $I_{GEN}$ generated by genset 10. The solid line 76 in graph 70 may represent an actual variation of currents $I_{METER}$, $I_{INT-CT}$, or $I_{GEN}$. As illustrated in FIG. 3, in some embodiments, the actual variation may have a generally sinusoidal shape representing an AC current. The shape of the current waveform may differ from the generally sinusoidal shape and may depend on one or more characteristics of load 32.

When the stepped down current $I_{METER}$ received from external transformer 34 is within a nominal operating current range of current meter 36, the current signal 48 generated by current meter 36 may accurately represent the shape of the varying AC current. For example, the current signal may be represented by solid line 76 as a generally sinusoidal curve extending from time 0 through time T and changing sign at time T/2. It is to be understood, however, that the current signal 48 may change sign at times other than time T/2 based on characteristics of load 32 and or other electrical components (e.g., filters, capacitors, inductors, resistors) and/or noise associated with the electrical circuit of system 30 and its components. Although a sinusoidal shape has been illustrated in FIG. 3, it is contemplated that the shape of the current signal (e.g., solid line 76) may vary from a purely sinusoidal shape because of disturbances in the current $I_{GEN}$ generated by genset 10 and/or variations in the current $I_{GEN}$ caused due to the presence of other electrical components (e.g., filters, capacitors, inductors, resistors) and/or noise associated with the electrical circuit of system 30 and its components.

An over-current condition may occur in system 30, for example, when there is a short-circuit, causing a flow of a very large amount of current, for example, greater than a maximum rated current of external transformer 34 (e.g., greater than 400 A for a transformer with a 400:5 transformer ratio, or greater than 1000 A for a transformer with 1000:1 transformer ratio). Although a short-circuit has been described as causing an over-current condition, an over-current condition may be caused by factors other than a short circuit. For example, an over-current condition may be caused due to malfunction or failure of one or more electrical devices or components (e.g., load 32). In such an over-current condition, the stepped down current $I_{METER}$ provided by external transformer 34 may exceed the nominal range of currents (1 A to 5 A) for current meter 36. When the current $I_{GEN}$ generated by genset 10 exceeds the maximum rated current, the stepped down current $I_{METER}$ provided by external transformer 34 may exceed the nominal range of currents for current meter 36. In this situation, the ferrite core 40 in internal transformer 44 may saturate so that little to no current $I_{INT-CT}$ may flow from internal transformer 44 to analog-to-digital converter 52 in current meter 36. For example, when core 40 of internal transformer 44 saturates, the current values generated by analog-to-digital converter 52, in current meter 36, may reduce to zero or to near zero values. Dashed line 78 in graph 70 illustrates the shape of the current signal 48 generated by current meter 36 when an over-current condition occurs. As illustrated by dashed line 78 in FIG. 3, when the current $I_{GEN}$ generated by genset 10 exceeds a maximum rated current, current signal 48 (e.g., representing $I_{INT-CT}$) as detected by current meter 36 may drop to about zero (see e.g., dropping to zero from first point 82) or may reduce to a low value until the current input changes sign at time T/2. Current signal 48 may then recover and begin tracking the input current $I_{METER}$ (or $I_{INT-CT}$) for a period of time until ferrite core 40 of internal transformer 44 saturates again, causing the current signal to drop to about zero (see e.g., from second point 84) or to a low value. Thus, instead of the accurate representation of the current signal shown by solid line 76, current meter 36 may generate the representation shown by dashed line 78. The term about in this disclosure should be interpreted as encompassing manufacturing, machining, and/or measurement tolerances and variations well known in the art. For example, a current value $I_{INT-CT}$ about equal to zero may encompass values of 0±0.1 mA, 0±0.2 mA, up to 0±0.5 mA.

As discussed above, controller 60 of current meter 36 may periodically sample current signal 48 to generate a plurality of current values representative of $I_{INT-CT}$, $I_{METER}$ and $I_{GEN}$. For example, as illustrated in FIG. 3, controller 60 may generate current values $i_1, i_2, i_3, \ldots, i_{N-1}, i_N$ at times $t_1, t_2, t_3, \ldots, t_{N-1}, t_N$, where $t_N$ corresponds to time T, and N is an integer ranging from 1 to infinity. Thus, for example, when current signal 48 is represented by solid line 76, controller 60 may generate current values $i_1$ through in that may accurately represent a shape of current signal 48. In contrast, when core 40 of internal transformer 44 is saturated, and current signal 48 is represented by dashed line 78, controller 60 may generate current values $i_M$ through $i_{N/2}$ and $i_K$ through $i_N$ that may be zero or near zero. As a result, an RMS value calculated based on current values $i_1$ through $i_N$ based on solid line 76 may be larger than the RMS value calculated based on current values $i_1$ through in based on dashed line 78.

Figure 4:
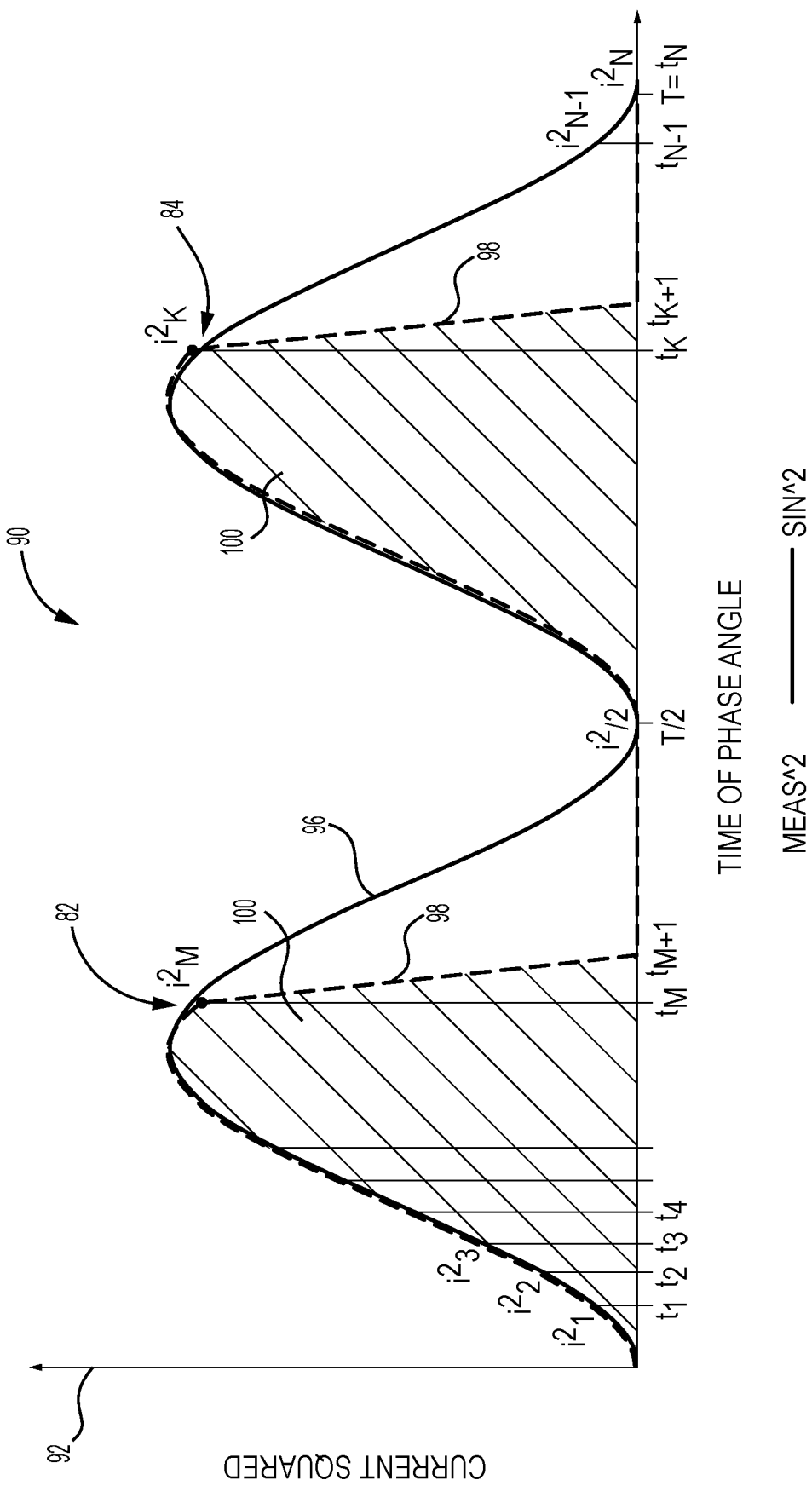
FIG. 4 is an exemplary graph illustrating the squared value of the current signal of FIG. 3.

FIG. 4 illustrates graph 90 showing an exemplary variation of a squared value of current signal 48. The ordinate or y-axis 92 in graph 90 may represent the square of the magnitude of the current signal, which in turn may be representative of a square of the magnitude of the current $I_{GEN}$ generated by genset 10. The abscissa or x-axis 94 in graph 90 may represent a phase angle or time associated with the stepped down currents $I_{METER}$, $I_{INT-CT}$, or the current $I_{GEN}$ generated by genset 10. The solid line 96 in graph 90 may represent the actual variation of the square of the current signal representing an AC current $I_{METER}$, when $I_{METER}$ is within a nominal operating current range of current meter 36. Dashed line 98 in graph 90 may illustrate the shape of the square of the current signal when an over-current condition occurs. For example, as illustrated by dashed line 98 in FIG. 4, when the stepped down current $I_{INT-CT}$ drops to about a zero or near zero value (e.g., starting at first point 82), the square of the current signal may also drop to about a zero or near zero value. And after the current $I_{INT-CT}$ changes sign, when the stepped down current $I_{INT-CT}$ drops to about a zero or near zero value (e.g., starting at second point 84), the square of the current signal may again drop to about a zero or near zero value.

The measured value, $I_{METER-MEAS}$, of the current $I_{METER}$ may be obtained based on a root-mean-square value of the current values reflected in current signal 48. Referring to FIG. 4, when the stepped down current $I_{METER}$ is within a nominal operating current range of current meter 36, the root-mean-square of the current values reflected in current signal 48 may be proportional to the area under the solid line 96 of graph 90 divided by the period or time T, and may accurately reflect the value of the current $I_{METER}$. For example if the time duration T is sampled at equal intervals of time for N times, controller 60 may determine the RMS value $I_{RMS}$ corresponding to $I_{METER}$ as follows:

$$I_{RMS} = R_{INT}\left[(i_1^2 + i_2^2 + i_3^2 + \ldots i_{N-1}^2 + i_N^2)/N\right]^{1/2}. \quad \text{Equation (1)}$$

In Equation (1), $R_{INT}$ represents the transformer ratio of internal transformer 44. Thus, for example, the RMS value corresponding to the current $I_{METER}$ being supplied to current meter 46 may be determined by scaling up the RMS value of the current signal 48 (corresponding to internal current $I_{INT-CT}$) by the transformer ration $R_{INT}$ of internal transformer 44. The RMS value $I_{RMS}$ is also sometimes referred to as the standard RMS value. When an over-current condition occurs, however, the current signal generated by current meter 36 may be represented by dashed line 78 (see e.g., FIG. 3) and the squared value of current may be represented by dashed line 98 of graph 90. As discussed above, for dashed line 78, the values of currents $i_M$ through $i_{N/2}$ and $i_K$ through in are about zero or near zero and, therefore, the values of current-squared $i_M^2$ through $i_{N/2}^2$ and $i_K^2$ through $i_N^2$ for dashed line 98 are also about zero or near zero. Thus, an RMS value $I_{RMS-SATURATED}$ determined by controller 60 using Equation (1) for dashed line 98 may be smaller than the RMS value $I_{RMS}$ determined by controller 60 using current values corresponding to solid line 96. This would occur because the values $i_M^2$ through $I_{N/2}^2$ and the values $i_K^2$ through $i_N^2$ may be about zero or near zero and may not contribute to the RMS calculation according to Equation (1). Thus, when an over-current condition occurs, the RMS value $I_{RMS}$ and, therefore, the measured value $I_{METER-MEAS}$ of the current $I_{METER}$ determined by controller 60 may be inaccurate.

In some exemplary embodiments, controller 60 may be able to obtain a more accurate measure of the RMS value of the current by using a modified RMS calculation. In the modified RMS calculation of the present disclosure, controller 60 may determine the RMS value using only current values associated with dashed line 98 obtained before core 40 of external transformer 34 saturates. Controller 60 may identify the current values that should be used for the modified RMS calculation by comparing the current values to a predetermined value. In some exemplary embodiments, the predetermined value may be about zero. Thus, for example, controller 60 may discard all current values associated with current signal 48 that are about zero. In other exemplary embodiments, the predetermined value may be a non-zero value. For example, as illustrated in FIG. 3, the predetermined value may correspond to $I_{PREDETERMINED}$, illustrated by the two lines 86 and 88. In these exemplary embodiments, controller 60 may discard all current values that fall between the two lines 86 and 88 when calculating the modified RMS value. For example, the predetermined value may include ±0.1 mA, ±0.2 mA, ±0.5 mA, or any other desired value. It is also contemplated that the predetermined value may be based on the RMS value. For example, the predetermined value may be smaller for a smaller RMS value (e.g., for the nominal range of $I_{METER}$ of 1 A) and larger for a larger RMS value (e.g., for the nominal range of $I_{METER}$ of 5 A). As one example, the predetermined value may be a fixed percentage of the RMS value (e.g., 1%, 2%, or any other desired fraction).

Controller 60 may obtain a modified RMS value representative of the current $I_{METER}$, using current values that exceed the predetermined value, as follows:

$$I_{MODIFIED-RMS} = \qquad\qquad\qquad\qquad\text{Equation (2)}$$
$$INT\left[(i_1^2 + i_2^2 + \ldots i_M^2)/M + (i_{N/2}^2 + i_{(N/2)+1}^2 + \ldots I_K^2)/(K - N/2)\right]^{1/2}$$

In other words, controller 60 may obtain a modified RMS value based on the hatched area 100 under dashed line 98 as illustrated in FIG. 4 as averaged over the period of time during which core 40 of external transformer 34 is not saturated (e.g., the period of time $t_M$-0 and $t_K$-$t_{N/2}$ during which dashed line 98 tracks solid line 96). And as discussed with respect to Equation (1), controller 60 may obtain a modified RMS value corresponding to the current $I_{METER}$ being supplied to current meter 46 by scaling up the modified RMS value of the current signal 48 (corresponding to internal current $I_{INT-CT}$) by the transformer ratio $R_{INT}$ of internal transformer 44. The modified RMS value $I_{MODIFIED-RMS}$ may be a more accurate estimate of $I_{RMS}$ as compared to the value $I_{RMS-SATURATED}$. As will be appreciated, as $I_{GEN}$ increases significantly over the maximum rated current, core 40 of internal transformer 44 may saturate earlier in each cycle. That is, the points M and K may move towards the left on graph 90, leaving a smaller and smaller hatched area 100 available for determination of the modified RMS value $I_{MODIFIED-RMS}$. This in turn may lead to increasing inaccuracies in $I_{MODIFIED-RMS}$ relative to $I_{RMS}$. As will be described below, such inaccuracies may be overcome by correcting the determined value of $I_{MODIFIED-RMS}$.

In some exemplary embodiments, controller 60 may be configured to sample current signal 48 at a relatively higher frequency when determining the modified RMS value as compared to when determining the standard RMS value. Controller 60 may sample current signal 48 at a higher frequency to determine the modified RMS value because such sampling may increase the number of available data points for the calculation, allowing controller 60 to obtain a more accurate estimate, for example, of the hatched area 100 under dashed line 98 of FIG. 4. As one example, controller 60 may sample the current signal at a frequency of 256 samples per cycle (e.g., over time T) when determining the modified RMS value as compared to 128 samples per cycle when determining the standard RMS value.

Although the range of currents for the nominal range of 5 A is 0 A-5 A, for some exemplary internal transformers 44, core 40 may be capable of handling significantly higher currents (3 times larger than the maximum rated current). Thus, for example, when external transformer 34 has a transformer ratio of 400:1, an over current of 3000 A or 4400 A may result in a stepped down current $I_{METER}$ of 7.5 A or 11 A. For some exemplary internal transformers 44, core 40 may not saturate even in an over-current condition having a current of 3000 A or 4400 A. For such transformers, current meter 36 may generate current signal 48 that may have a shape as represented by solid line 96 even at $I_{METER}$ values much higher than 5 A. In one exemplary embodiment, current meter 36 may generate current signal 48 that may have a shape as represented by solid line 96 even at values of $I_{METER}$ of about 11 A. Thus, for these exemplary external transformers 34, it may be possible to use the standard RMS value $I_{RMS}$ as obtained using Equation (1) as a measurement $I_{METER-MEAS}$ of the stepped down current $I_{METER}$ far exceeding 5 A and up to a value of 11 A. Although a value of 11 A has been described above, it is contemplated that different internal transformers 44 may have different core saturation current thresholds than 11 A.

In some exemplary embodiments, there may also be accuracy requirements for the measured current. For example, industrial or government regulations, industry standards, or other specifications may require determination of the measured generator current $I_{GEN-MEAS}$ using current meter 36 to a much higher accuracy up to a predetermined transformer current threshold. The accuracy requirements may be less stringent for measuring currents that exceed that predetermined transformer current threshold. Accordingly, in some embodiments, three transformer current thresholds may be defined for internal transformer 44. A first transformer current threshold $I_{THRESHOLD1}$ may represent a current value up to which the standard RMS value $I_{RMS}$ based on Equation (1) may provide a sufficiently accurate measured value $I_{METER-MEAS}$ and, therefore, a sufficiently accurate measured value $I_{GEN-MEAS}$ of the current $I_{GEN}$ generated by genset 10. As discussed above, in some exemplary embodiments, $I_{THRESHOLD1}$ may be about 11 A, although other values are also contemplated. A second transformer current threshold, $I_{THRESHOLD2}$, may represent a current value such that for current values between first transformer current threshold $I_{THRESHOLD1}$ and the second transformer current threshold, a correction may be required to meet the accuracy requirements. The second transformer current threshold $I_{THRESHOLD2}$ may be greater than the first transformer current threshold $I_{THRESHOLD1}$. As discussed above, in some exemplary embodiments, $I_{THRESHOLD2}$ may be about 13 A, although other values are also contemplated. And, a third transformer current threshold, $I_{THRESHOLD3}$, may represent a current value such that detection of currents having a magnitude greater than the third transformer current threshold may be subject to less stringent accuracy requirements. The third transformer current threshold $I_{THRESHOLD2}$ may be greater than both the first transformer current threshold $I_{THRESHOLD1}$ and the second transformer current threshold $I_{THRESHOLD2}$. In some exemplary embodiments, $I_{THRESHOLD3}$ may be about 20 A, although other values are also contemplated. It is contemplated that for current values between the second transformer current threshold $I_{THRESHOLD2}$ and the third transformer current threshold $I_{THRESHOLD3}$, a correction may be required to meet the accuracy requirements a result. However, for current values greater than the third transformer current threshold $I_{THRESHOLD3}$, using the modified RMS value $I_{MODIFIED-RMS}$, even though inaccurate may be sufficient to meet the accuracy requirements.

Thus, for example, controller 60 may sample current signal 48 at a predetermined frequency and may use the sampled data points to determine a standard RMS value $I_{RMS}$ based on Equation (1). Controller 60 may compare the standard RMS value $I_{RMS}$ with the first transformer current threshold $I_{THRESHOLD1}$ (e.g. 11 A). When controller 60 determines that the standard RMS value $I_{RMS}$ value is equal to or less than the first transformer current threshold $I_{THRESHOLD1}$, controller 60 may determine the measured value $I_{METER-MEAS}$ of the current value being supplied to current meter 36 by transformer as the standard RMS value $I_{RMS}$. In this case, controller 60 may determine the measured value $I_{GEN-MEAS}$ of the current being generated by genset 10 by scaling up the measured value $I_{METER-MEAS}$ by the transformer ratio associated with external transformer 34. For example, assuming that external transformer 34 has a transformer ratio of 400:1, controller 60 may determine the value of $I_{GEN}$-MEAS by multiplying $I_{METER-MEAS}$ with 400 (e.g., 400 $I_{METER-MEAS}$). As another example, for an external transformer 34 with a transformer ratio of 1000:5, controller 60 may determine the value of $I_{GEN}$-MEAS by multiplying $I_{METER-MEAS}$ with (1000/5) (e.g., (1000 $I_{METER-MEAS}$)/5). Thus, in this case, the measured value of the current being generated by genset 10 may be based on the RMS value of the stepped down current supplied to current meter 36.

When controller 60 determines that the standard RMS value $I_{RMS}$ estimated based on Equation (1) exceeds the first transformer current threshold $I_{THRESHOLD1}$ but is lower than the second transformer current threshold $I_{THRESHOLD2}$, controller 60 may employ an interpolation scheme to determine the value $I_{METER-MEAS}$. Such an interpolation scheme may be required to correct the modified RMS value $I_{MODIFIED-RMS}$. As discussed above, the modified RMS value $I_{MODIFIED-RMS}$ is determined by ignoring portions of the current signal under saturation (e.g., portions of the current signal where current values are about zero or near zero). As the current generated by genset 10 exceeds the maximum rated current by larger and larger amounts, the portion of the current signal under saturation increases, which in turn may lead to greater inaccuracies in the modified RMS value $I_{MODIFIED-RMS}$.

Figure 5:
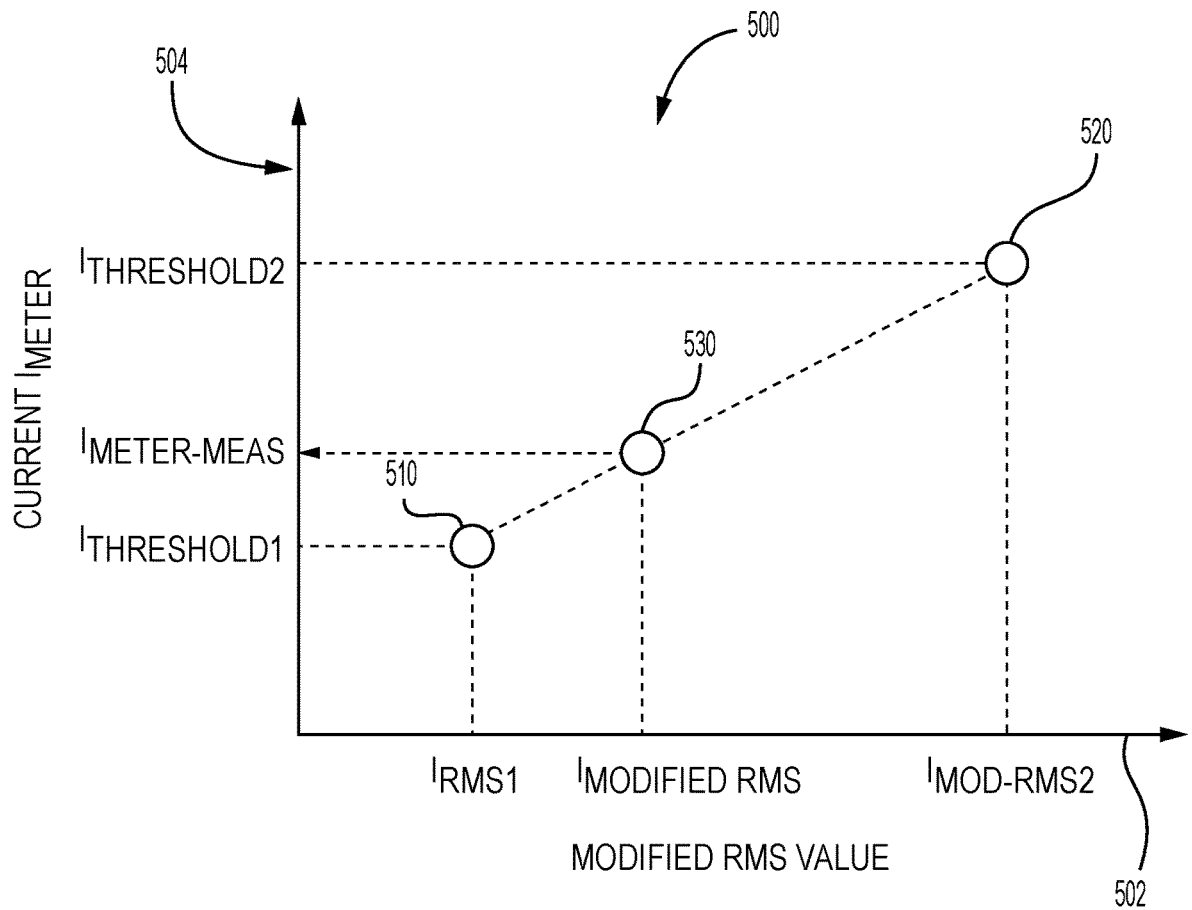
FIG. 5 is a graph illustrating an exemplary method of interpolation for determining a measured current generated by the genset of FIG. 1.

FIG. 5 is a graph illustrating an exemplary interpolation scheme for determining a measured current generated by the genset of FIG. 1 by correcting the modified RMS value $I_{MODIFIED-RMS}$, when the RMS value $I_{RMS}$ falls between the first and second transformer current thresholds. The ordinate or y-axis 504 in graph 500 may represent a magnitude of the current $I_{METER}$, whereas the abscissa or x-axis 502 in graph 500 may represent the modified RMS values. The interpolation scheme may be based on a plurality of empirical measurements. For the first empirical measurement, a current corresponding to the first transformer current threshold $I_{THRESHOLD1}$ may be supplied to current meter 46. In one exemplary embodiment, such a current may be supplied using calibration equipment. As discussed above, core 40 of internal transformer 44 may not saturate under these conditions. As a result, the standard RMS value $I_{RMS}$ estimated based on Equation (1) may provide an accurate estimation of $I_{METER}$ corresponding to the first transformer current threshold $I_{THRESHOLD1}$. It will also be understood that because core 40 does not saturate, there are no points M through N/2 or K through N at which the current values associated with the current signal generated by current meter 36 are below the predetermined value. Thus, a modified RMS current value $I_{MOD-RMS1}$ determined using Equation (2) may be about equal to the standard RMS value $I_{RMS}$ determined using Equation (1). Further the modified RMS current value $I_{MOD-RMS1}$ and the standard RMS value $I_{RMS}$ may both be about equal to $I_{THRESHOLD1}$. This condition is represented in FIG. 5 by point 510.

For the second empirical measurement, a current corresponding to the second transformer current threshold $I_{THRESHOLD2}$ may be supplied to current meter 46. In one exemplary embodiment, such a current may be supplied using calibration equipment. As discussed above, core 40 of internal transformer 44 may saturate under these conditions. As a result, the standard RMS value of the current $I_{METER}$ may be inaccurate and a modified RMS value $I_{MOD-RMS2}$ may be obtained using Equation (2). This condition is represented in FIG. 5 by point 520. It is contemplated that in some exemplary embodiments, the measured values $I_{RMS1}$ and $I_{MOD-RMS2}$ may be obtained by supplying known currents $I_{THRESHOLD1}$ and $I_{THRESHOLD2}$ using one or more pieces of calibration equipment to a plurality of current meters 46 and the values of $I_{RMS1}$ and $I_{MOD-RMS2}$ used for points 510 and 520 may be obtained as average values, median values, maximum values, or based on some other statistical evaluation of the corresponding values obtained using the plurality of current meters 46.

As also illustrated in FIG. 5, points 510 and 520 may be used to interpolate between the first and second transformer current thresholds in order to correct any modified RMS value $I_{MODIFIED-RMS}$ determined using Equation (2) for current $I_{METER}$, ranging between the first and second transformer current thresholds. For example, as discussed above, when the RMS value $I_{RMS}$ as determined using Equation (1) is greater than the first transformer current threshold $I_{THRESHOLD1}$ and less than or equal to the second transformer current threshold $I_{THRESHOLD2}$, controller 60 may determine a modified RMS value $I_{MODIFIED-RMS}$ corresponding to the current $I_{METER}$ using Equation (2). Further, the interpolation scheme as illustrated in FIG. 5 may be used to correct the calculated modified RMS value $I_{MODIFIED-RMS}$ (e.g, corresponding to point 530) to accurately determine a measured value $I_{METER-MEAS}$ corresponding to the current $I_{METER}$ being supplied to current meter 36 as follows:

$$I_{METER-MEAS} = I_{RMS1} + [(I_{THRESHOLD2} - I_{THRESHOLD1}) \quad (3)$$
$$(I_{MODIFIED-RMS} - I_{RMS1})/(I_{MOD-RMS2} - I_{RMS1})]$$

Although a linear interpolation has been discussed above with respect to FIG. 5, it is contemplated that a non-linear interpolation scheme (e.g., quadratic or a higher order polynomial) may be used for determining the measured value $I_{METER-MEAS}$ by correcting the modified RMS value $I_{MODIFIED-RMS}$. As discussed above, controller 60 may determine the measured value $I_{GEN}$-MEAS of the current being generated by genset 10 by scaling up the measured value $I_{METER-MEAS}$ by the transformer ratio associated with external transformer 34. Thus, in this case, the measured value of the current being generated by genset 10 may be based on both the RMS value and the modified RMS value of the stepped down current supplied to current meter 36.

Figure 6B:
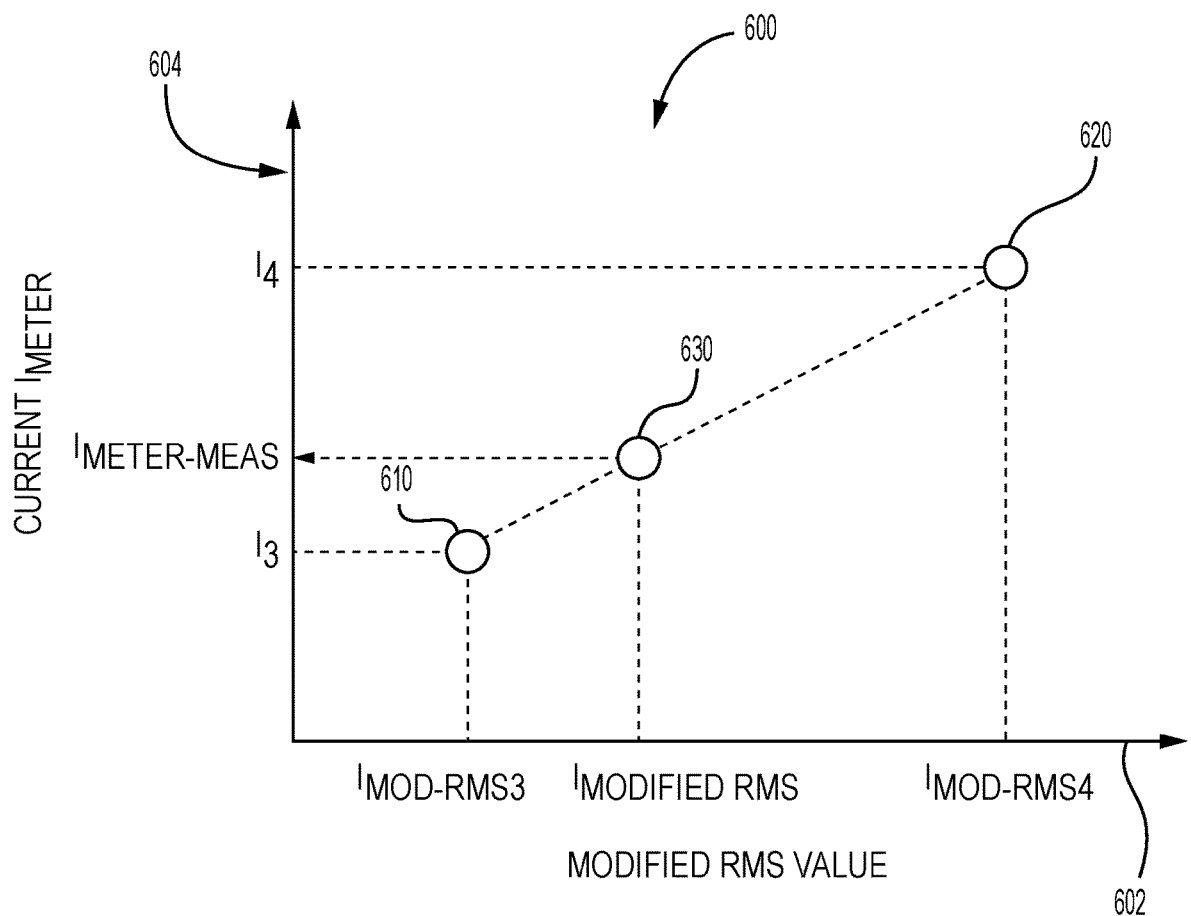
FIG. 6B is a graph illustrating an exemplary method of correction for determining the measured current generated by the genset of FIG. 1.

As discussed above, as the stepped down current $I_{METER}$ supplied to current meter 36 exceeds the nominal current range by larger and larger amounts, the portion of the current signal under saturation increases, which in turn may lead to greater inaccuracies in the calculated modified RMS value $I_{MODIFIED-RMS}$. Thus, it may be necessary to correct the modified RMS value $I_{MODIFIED-RMS}$ when the stepped down current $I_{METER}$ exceeds the second transformer current threshold $I_{THRESHOLD2}$. As discussed above, known currents exceeding $I_{THRESHOLD2}$ may be supplied to current meter 46 using calibration equipment and the modified RMS values corresponding to the supplied current may be determined using Equation (2). Based on these empirical measurements, it may be possible to determine correction factors for various ranges of currents between the second transformer current threshold $I_{THRESHOLD2}$ and the third current threshold $I_{THRESHOLD3}$. For example, as illustrated in FIG. 6A, the range of currents $I_{THRESHOLD2}$ through $I_{THRESHOLD3}$ may be divided into plurality of segments, each segment defining a current range (e.g., $I_{THRESHOLD2}$ to $I_1$, $I_1$ to $I_2$, $I_2$ to $I_3$, $I_3$ to $I_4$, . . . , $I_6$ to $I_{THRESHOLD3}$, etc.). Currents $I_{THRESHOLD2}$, $I_1$, $I_2$, $I_2$ $I_3$, . . . , $I_6$, $I_{THRESHOLD3}$ etc. may be supplied to current meter 46 and the corresponding modified RMS values obtained using Equation (2). Further, for each of the plurality of segments a correction factor may be determined using an interpolation scheme (e.g., linear interpolation scheme) similar to that illustrated in FIG. 5. For example, as illustrated in FIG. 6B a slope of a linear curve between $I_3$ and $I_4$ may be determined as follows:

$$\text{Slope } m_{34} = [(I_4 - I_3)/(I_{MOD-RMS4} - I_{MOD-RMS3})] \quad (4)$$

In Equation (4), currents $I_3$ and $I_4$ may be supplied using calibration equipment, and the currents $I_{MOD-RMS3}$ and $I_{MOD-RMS4}$ may be determined using Equation (2) and using an internal transformer 44 having a core 40 that saturates when supplied with currents $I_3$ or $I_4$. In FIG. 6B, axes 602 and 604 graph 600 may be similar to axes 502 and 504, respectively, discussed above. Likewise, points 610, 620, and 630 may be similar to points 510, 520, 530, respectively, discussed above. The correction factor $A_4$ for the segment $I_3$ to $I_4$ may include the slope $m_{34}$ and an intercept $I_3$. And any modified RMS value $I_{MODIFIED-RMS}$ lying between the modified RMS values $I_{MOD-RMS3}$ and $I_{MOD-RMS4}$, corresponding to the segment defined by currents $I_3$ and $I_4$, may be corrected to obtain a measured value $I_{METER-MEAS}$ corresponding to the current $I_{METER}$ being supplied to current meter 46 as follows:

$$I_{METER-MEAS} = I_3 + m_{34} \cdot (I_{MODIFIED-RMS} - I_{MOD-RMS3}) \quad (5)$$

As another example, by replacing the currents $I_3$ and $I_4$ in FIG. 6B by $I_5$ and $I_6$, and by replacing the values $I_{MOD-RMS3}$ and $I_{MOD-RMS4}$ in FIG. 6B with the values $I_{MOD-RMS5}$ and $I_{MOD-RMS6}$, a slope of a linear curve between $I_5$ and $I_6$ may be determined as follows:

$$\text{Slope } m_{56} = [(I_6 - I_5)/(I_{MOD-RMS6} - I_{MOD-RMS5})] \quad (6)$$

In Equation (6), currents Is and $I_6$ may be supplied using calibration equipment, and the currents $I_{MOD-RMS5}$ and $I_{MOD-RMS6}$ may be determined using Equation (2) and using an internal transformer 44 having a core 40 that saturates when supplied with currents $I_5$ or $I_6$. The correction factor $A_6$ for the segment $I_5$ to $I_6$ may include the slope $m_{56}$ and an intercept $I_5$. And any modified RMS value $I_{MODIFIED-RMS}$ lying between the modified RMS values $I_{MOD-RMS5}$ and $I_{MOD-RMS6}$, corresponding to the segment defined by currents $I_5$ and $I_6$, may be corrected to obtain a measured value $I_{METER-MEAS}$ corresponding to the current $I_{METER}$ being supplied to current meter 4 as follows:

$$I_{METER-MEAS} = I_5 + m_{56} \cdot (I_{MODIFIED-RMS} - I_{MOD-RMS5}) \quad (7)$$

FIG. 6A illustrates a table 600 showing an exemplary set of segments between the current range $I_{THRESHOLD2}$ through $I_{THRESHOLD3}$ and the corresponding correction factors $A_1$ through $A_7$ for each of the segments. As also discussed above with respect to FIG. 5, in some exemplary embodiments, the measured values $I_{MOD-RMS1}$, $I_{MOD-RMS2}$, $I_{MOD-RMS3}$, etc., may be obtained by supplying known currents $I_1$, $I_2$, $I_3$, etc., using one or more pieces of calibration equipment to a plurality of current meters 46 and the values of $I_{MOD-RMS1}$, $I_{MOD-RMS2}$, $I_{MOD-RMS3}$, etc., may be obtained as average values, median values, maximum values, or based on some other statistical evaluation of the corresponding values obtained using the plurality of current meters 46. It is also contemplated that the correction factors may be determined apriori for current meter 46 during manufacture, calibration, and/or inspection of current meter 46 before current meter 46 is deployed for measurement of the current generated by genset 10 in the field.

As discussed above, controller 60 may determine an RMS value of the current $I_{METER}$ to obtain a measured value $I_{METER-MEAS}$ corresponding to the current provided by external transformer 34 to current meter 46. When the value of $I_{METER-MEAS}$ exceeds the second transformer current threshold $I_{THRESHOLD2}$ and is less than or equal to the third current threshold $I_{THRESHOLD3}$, the modified RMS value $I_{MODIFIED-RMS}$ determined using Equation (2) may be corrected using a piecewise interpolation scheme based on the correction factors for a selected segment between the current range $I_{THRESHOLD2}$ through $I_{THRESHOLD3}$. In particular, when the value of $I_{METER-MEAS}$ exceeds the second transformer current threshold $I_{THRESHOLD2}$ and is less than or equal to the third current threshold $I_{THRESHOLD3}$, a modified RMS value $I_{MODIFIED-RMS}$ corresponding to $I_{METER}$ may be compared with the modified RMS currents bounding each segment (e.g., with currents $I_{MOD-RMS2}$ and $I_{MOD-RMS3}$, or $I_{MOD-RMS3}$ and $I_{MOD-RMS4}$, etc.) to determine a target segment to which current $I_{MODIFIED-RMS}$ belongs. For example, when current $I_{MODIFIED-RMS}$ lies between currents $I_{MOD-RMS2}$ and $I_{MOD-RMS3}$, the target segment may be a current range bounded by currents $I_2$ and $I_3$. In this case, a measured value of the current being supplied to current meter 46 (e.g., $I_{METER-MEAS}$) may be determined by correcting the modified RMS value $I_{MODIFIED-RMS}$ using the correction factor $A_3$ (see e.g., FIG. 6A) for the segment bounded by currents $I_2$ and $I_3$. As another example, when current $I_{MODIFIED-RMS}$ lies between currents $I_{MOD-RMS4}$ and $I_{MOD-RMS5}$, the target segment may be a current range bounded by currents $I_4$ and Is. In this case, a measured value of the current being supplied to current meter 46 (e.g., $I_{METER-MEAS}$) may be determined by correcting the modified RMS value $I_{MODIFIED-RMS}$ using the correction factor $A_5$ (see e.g., FIG. 6A) for the segment bounded by currents $I_4$ and $I_5$. As discussed above, controller 60 may determine the measured value $I_{GEN-MEAS}$ of the current being generated by genset 10 by scaling up the measured value $I_{METER-MEAS}$ by the transformer ratio associated with external transformer 34. Thus, in this case, the measured value of the current being generated by genset 10 may be based on the modified RMS value of the stepped down current supplied to current meter 36.

As also discussed above, when the value of current $I_{METER}$ exceeds the third current threshold $I_{THRESHOLD3}$, no correction factors may be applied because of the relaxed accuracy requirements for measurement of such high currents. In this case, the modified RMS value may be used as the measured value $I_{METER-MEAS}$ of the current being supplied to current meter 36. As discussed above, controller 60 may determine the measured value $I_{GEN-MEAS}$ of the current being generated by genset 10 by scaling up the measured value $I_{METER-MEAS}$ by the transformer ratio associated with external transformer 34. Thus, in this case, the measured value of the current being generated by genset 10 may be based only on the modified RMS value of the stepped down current supplied to current meter 36.

Controller 60 may also compare the measured current value $I_{GEN-MEAS}$ with an over-current threshold. When the measured current value $I_{GEN-MEAS}$ corresponding to the current $I_{GEN}$ generated by genset 10 exceeds the over-current threshold, controller 60 may adjust an operation of genset 10. In some exemplary embodiments, the overcurrent threshold may be two or three times larger than the maximum rated current of external transformer 34. For example, for an external transformer 34 having a transformer ratio of 400:1, the over-current threshold may be 3000 A, 4200 A, or any other desired value greater than 400 A. It should be understood that the over-current values of 3000 A, 4200 A, etc., are exemplary and non-limiting and the over-current threshold may be selected as desired according to a particular application or electrical device to which genset 10 may supply electricity, or based on any other criteria.

Controller 60 may adjust an operation of genset 10 by stopping engine 12, thereby stopping generation of electricity by generator 14. In other exemplary embodiments, controller 60 may adjust an operation of genset 10 by tripping a relay that may prevent a flow of current from generator 14 to load 32. In yet other exemplary embodiments, controller 60 may adjust an operation of genset 10 by issuing a visual and/or audible alert. For example, controller 60 may issue a visual alert by activating one or more lights (e.g., red or yellow lights) associated with genset 10. Additionally or alternatively, controller 60 may transmit a signal to a user device (e.g., desktop computer, laptop computer, mobile phone, a tablet, etc.) associated with an operator of genset 10. The transmitted signal may cause the user device to display a warning or an alert on a display screen associated with the user device. The alert may include for example one or more icons and/or text messages indicating that the current being generated by genset 10 has exceeded the over-current threshold. It is also contemplated that in addition to the visual alert described above, controller 60 may be configured to activate one or more speakers, causing the speakers to emit sounds that may include, for example, sirens, alarms and/or speech indicating that the current being generated by genset 10 has exceeded an over-current threshold.

A method of operating genset 10 and controlling operation of genset 10 will be described below.

INDUSTRIAL APPLICABILITY

Internal transformer 44 and controller 60 of the present disclosure may be used to accurately measure the current $I_{GEN}$ being generated by genset 10. Furthermore, the measured current $I_{GEN-MEAS}$ may be used to control operations of genset 10. The disclosed system and method may provide several advantages. For example, the disclosed system and method may allow for accurate measurement of the current generated by genset 10 even in over-current conditions in which the current $I_{GEN}$ may significantly exceed a maximum rated current associated with genset 10 and/or external transformer 34. Furthermore, the disclosed system and method may allow for accurate measurement of the current generated by genset 10 without the need for expensive larger capacity internal/external transformers or the need for multiple internal/external transformers 34. This may in turn help reduce the cost and size of genset 10 and its control system and/or a cost and size of current meter 36. As yet another advantage, the disclosed system and method may allow for determination of the measured genset current $I_{GEN-MEAS}$ using less memory and less intensive computational tasks as compared to conventional methods by eliminating the need to reconstruct a saturated current profile.

Figure 7A:
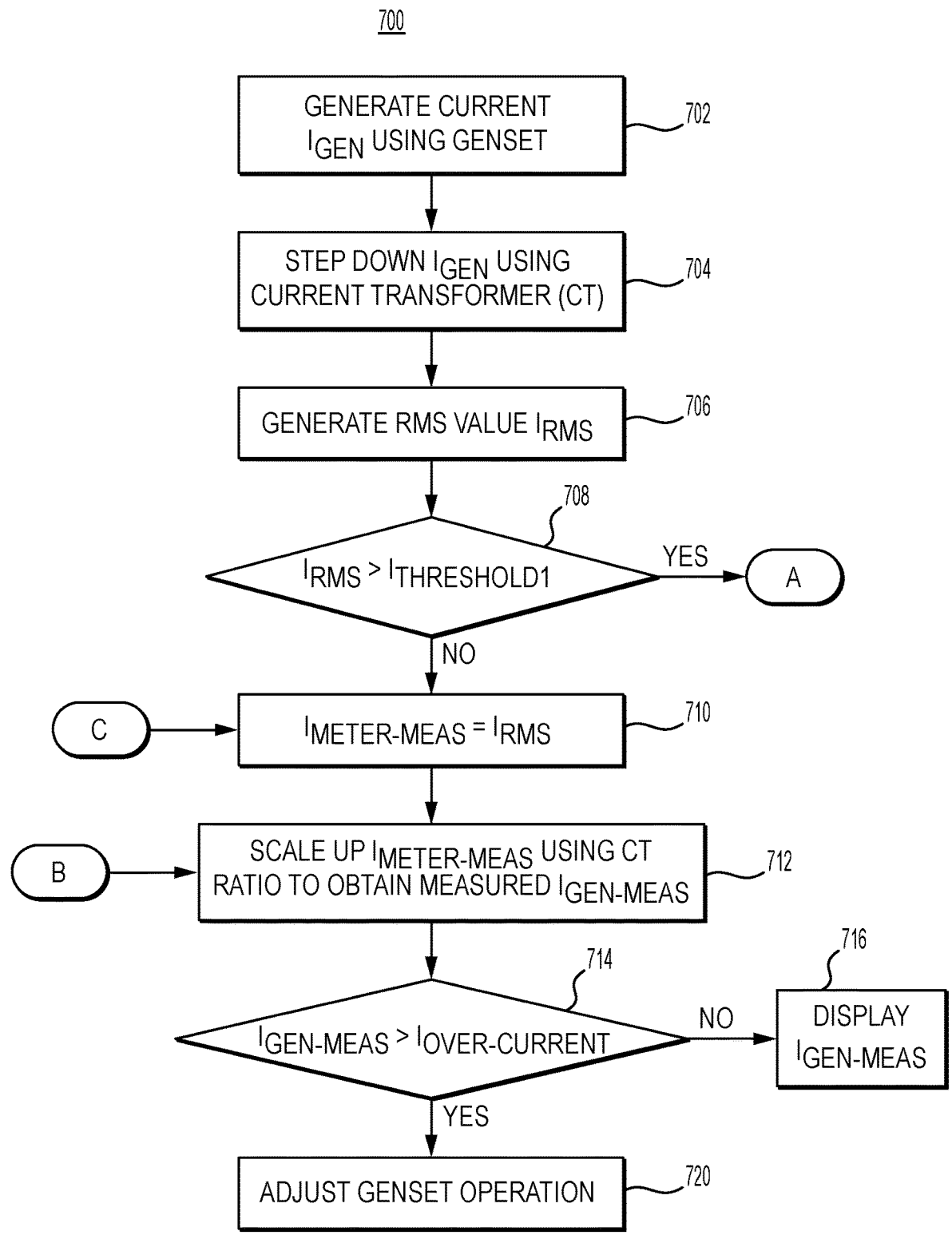
FIGS. 7A and 7B illustrate flowcharts of an exemplary method of operating the genset of FIG. 1.
Figure 7B:
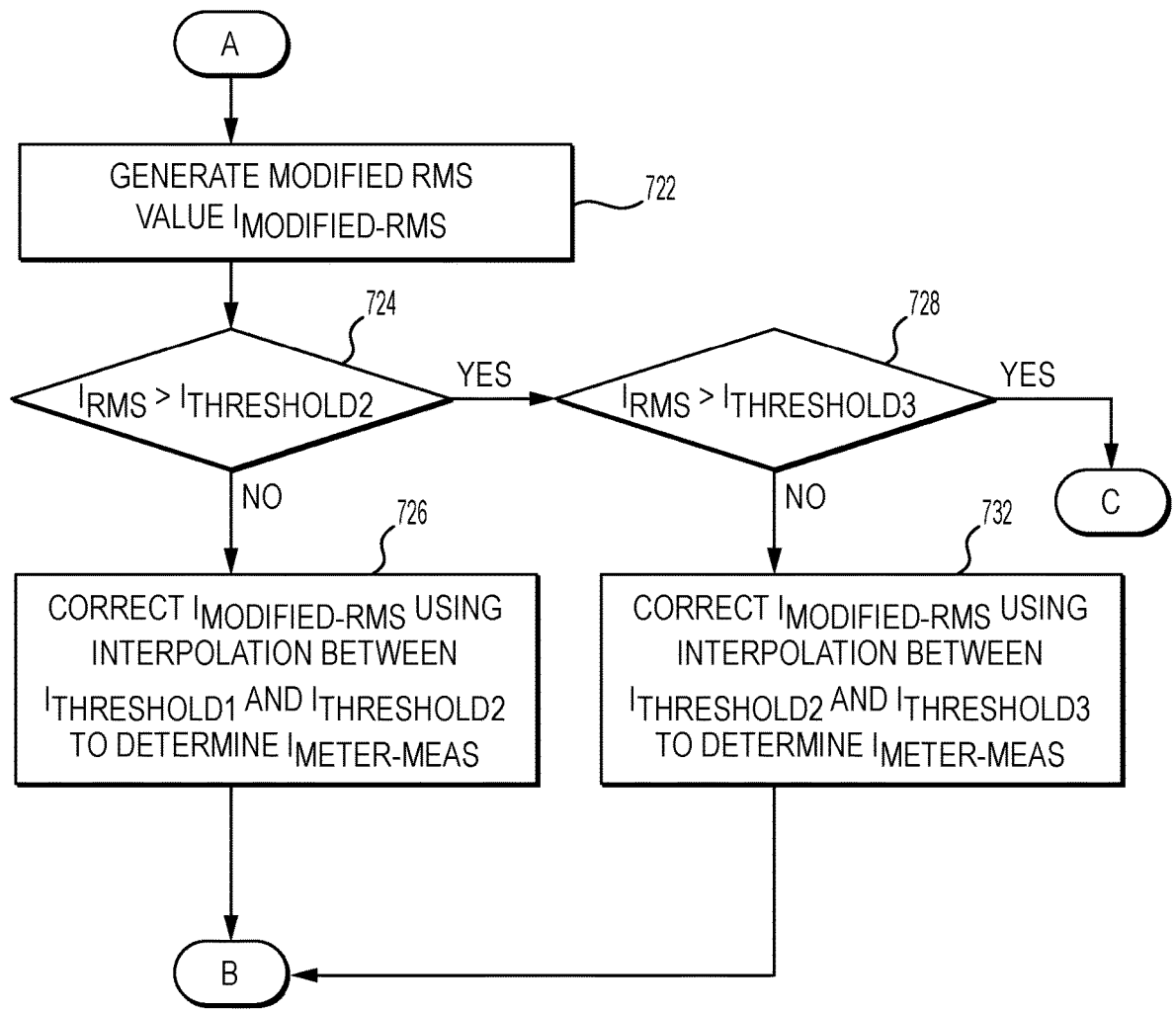

FIGS. 7A and 7B illustrate an exemplary method 700 of controlling the operations of genset 10 by determining the measured genset current $I_{GEN-MEAS}$ using a conventional internal current transformer 44. The order and arrangement of steps of method 700 is provided for purposes of illustration. As will be appreciated from this disclosure, modifications may be made to method 700 by, for example, adding, combining, removing, and/or rearranging the steps of method 700. Some or all steps of method 700 may be executed by controller 60, controller 20, other components of system 30, and/or a combination thereof.

Method 700 may include a step of generating a current using a generator set 10 (Step 702). For example, as discussed above, engine 12 of genset 10 may drive generator 14. Generator 14 may include a rotor (not shown) that may rotate relative to a stator (not shown). The crankshaft of engine 12 may be configured to rotate the rotor relative to the stator. The rotor and stator may each include a set of electrical coils. As the rotor rotates, an AC current may be induced in the coils of the stator. The AC current may be directed out of generator 14 via one or more terminals (not shown).

Method 700 may include a step of stepping down the generated current $I_{GEN}$ to a stepped down current $I_{METER}$, using external current transformer 34 and internal current transformer 44 (Step 704). For example, as discussed above, in one exemplary embodiment, external current transformer 44 may step down the current $I_{GEN}$ being generated by genset 10 to the current $I_{METER}$ supplied to current meter 36. Internal current transformer 44 of current meter 36 may include primary winding 38, core 40, and secondary winding 42. An alternating current, for example, $I_{METER}$ passing through primary winding 38 may produce an alternating magnetic field in core 40, which may then induce an alternating current, $I_{METER}$, in secondary winding 42. The stepped down current $I_{INT-CT}$ may be measured by current meter 36.

Method 700 may include a step of generating a RMS value of the current delivered to current meter 36 (Step 706). For example, as discussed above current meter 36 may receive the stepped down current $I_{METER}$ and may generate current signal 48 corresponding to current $I_{METER}$. Controller 60 of current meter 36 may sample current signal 48 at a predetermined frequency and may generate a plurality of current values. Controller 60 may also be configured to generate an RMS value $I_{RMS}$ using the plurality of current values, for example, based on Equation (1).

Method 700 may include a step of determining whether the RMS value $I_{RMS}$ is greater than a first transformer current threshold $I_{THRESHOLD1}$ (Step 708). For example, controller 60 may compare the RMS value $I_{RMS}$ with first transformer current threshold $I_{THRESHOLD1}$. In some exemplary embodiments, the first transformer current threshold $I_{THRESHOLD1}$ may be about 11 A, although other values of the first transformer current threshold are also contemplated. When controller 60 determines that the RMS value $I_{RMS}$ is less than or equal to the first transformer current threshold $I_{THRESHOLD1}$ (Step 708: NO), controller 60 may proceed to step 710 in which controller may determine that the measured value $I_{METER-MEAS}$ of $I_{METER}$ is equal to the RMS value $I_{RMS}$ (e.g., $I_{METER-MEAS}=I_{RMS}$) determined, for example, in step 706.

Method 700 may include a step of scaling up the measured value $I_{METER-MEAS}$ using the transformer ratio of external transformer 34 to obtain the measured value $I_{GEN-MEAS}$ of the current generated by genset 10 according to one or more methods of scaling up described above (Step 712). Method 700 may include a step of determining whether the measured value $I_{GEN-MEAS}$ of the current generated by genset 10 is greater than an over-current threshold $I_{OVER-CURRENT}$ (Step 714). In one exemplary embodiment the over-current threshold may be 3000 A, 4000 A, 5000 A, 10000 A, or any other high current value that may cause damage to genset 10 and/or system 30. When controller 60 determines that the measured value $I_{GEN-MEAS}$ of the current generated by genset 10 is greater than the over-current threshold $I_{OVER-CURRENT}$ (Step 714: YES), controller 60 may proceed to step 720. When controller 60 determines, however, that the measured value $I_{GEN-MEAS}$ of the current generated by genset 10 is less than or equal to the over-current threshold $I_{OVER-CURRENT}$ (Step 714: NO), controller 60 may be configured to display the measured value $I_{GEN-MEAS}$ on a display screen associated with genset 10, and/or on a display screen of a user device associated with an operator of genset 10 (Step 716).

In step 720, controller 60 may be configured to adjust an operation of genset 10 (Step 720). In some exemplary embodiments, controller 60 may adjust an operation of genset 10 by stopping engine 12, thereby stopping generation of electricity by generator 14. In other exemplary embodiments, controller 60 may adjust an operation of genset 10 by tripping a relay that may prevent a flow of current from generator 14 to load 32. In yet other exemplary embodiments, controller 60 may adjust an operation of genset 10 by issuing a visual and/or audible alert as described above. It is contemplated that controller 60 may perform one or more of these adjustments by directly controlling the operation of genset 10 and/or by transmitting signals to genset controller 20 that may in turn make the one or more adjustments.

Returning to step 708, when controller 60 determines that the RMS value $I_{RMS}$ is greater than the first transformer current threshold $I_{THRESHOLD1}$ (Step 708: YES), controller 60 may proceed to step 722 of generating a modified RMS value $I_{MODIFIED-RMS}$ (Step 722) for current signal 48 generated by current meter 36, using, for example, Equation (2). Method 700 may include a step of determining whether the RMS value $I_{RMS}$, calculated in, for example, step 706 is greater than the second transformer current threshold $I_{THRESHOLD2}$ (Step 724). In some exemplary embodiments, the second transformer current threshold $I_{THRESHOLD2}$ may be about 13 A, although other values of the second transformer current threshold are also contemplated. When controller 60 determines that the RMS value $I_{RMS}$ is less than or equal to the second transformer current threshold $I_{THRESHOLD2}$ (Step 724: NO), controller 60 may proceed to step 726.

In step 726, controller 60 may be configured to correct the modified RMS value $I_{MODIFIED-RMS}$ using an interpolation scheme to interpolate between the first transformer current threshold $I_{THRESHOLD1}$ and the second transformer current threshold $I_{THRESHOLD2}$ (Step 726). For example, as discussed above with respect to FIG. 5, controller 60 may be configured to determine the measured value $I_{METER-MEAS}$ of the current $I_{METER}$ supplied to current meter 36 by correcting the modified RMS value $I_{MODIFIED-RMS}$ using, for example, Equation (3). Controller 60 may be configured to proceed from step 726 to step 712 after determining the measured value $I_{METER-MEAS}$.

Returning to step 724, when controller 60 determines, however, that the RMS value $I_{RMS}$ is greater than the second transformer current threshold $I_{THRESHOLD2}$ (Step 724: YES), controller 60 may proceed to step 728. In step 728, controller 60 may be configured to determine whether the RMS value $I_{RMS}$, calculated in, for example, step 706 is greater than the third transformer current threshold $I_{THRESHOLD3}$ (Step 728). In some exemplary embodiments, the third transformer current threshold $I_{THRESHOLD2}$ may be about 20 A, although other values of the third transformer current threshold are also contemplated. When controller 60 determines that the RMS value $I_{RMS}$ is greater than or equal to the third transformer current threshold $I_{THRESHOLD3}$ (Step 728: YES), controller 60 may return to step 710. When controller 60 determines, however, that the RMS value $I_{RMS}$ is less than the third current threshold $I_{THRESHOLD3}$ (Step 728: NO), controller 60 may proceed to step 732. In step 732, controller 60 may be configured to correct the modified RMS value $I_{MODIFIED-RMS}$ using a piecewise linear interpolation scheme between the second transformer current threshold $I_{THRESHOLD2}$ and the third transformer current threshold $I_{THRESHOLD3}$ (Step 732). For example, as discussed above with respect to FIG. 6, controller 60 may be configured to identify a target segment corresponding to the modified RMS value $I_{MODIFIED-RMS}$ from the plurality of current ranges between the second transformer current threshold $I_{THRESHOLD2}$ and the third current threshold $I_{THRESHOLD3}$ as described above. Further, controller 60 may be configured to determine the correction factor (e.g., including the slope and the intercept) for the target segment. Controller 60 may be configured to determine the measured value of current $I_{METER-MEAS}$ corresponding to the current $I_{METER}$ supplied to current meter 36 by correcting the modified RMS value $I_{MODIFIED-RMS}$ using, for example, an equation similar to Equations (4) and (5) or Equations (6) and (7). After determining the measured value of current $I_{METER-MEAS}$, controller 60 may be configured to return to step 710.

It is to be noted that when some exemplary embodiments are described in this disclosure as exhibiting a feature or characteristic, some or all the other exemplary embodiments described in this disclosure may also exhibit that same feature or characteristic. It will be apparent to those skilled in the art that various modifications and variations can be made to the disclosed system and method of controlling the operation of a genset. Other embodiments will be apparent to those skilled in the art from consideration of the specification and practice of the disclosed system and method of controlling the operation of a genset. It is intended that the specification and examples be considered as exemplary only, with a true scope being indicated by the following claims and their equivalents.

What is claimed is:

1. A method of operating a generator set, the method comprising:
   generating a current using the generator set;
   stepping down the generated current to a stepped down current, using an internal current transformer;
   measuring the stepped down current using a current meter, the current meter being configured to generate a current signal representative of the stepped down current;
   generating, using a controller, a root-mean-square (RMS) value using a plurality of current values associated with the current signal;
   generating, using the controller, a modified RMS value, using current values, selected from the plurality of current values, and that are greater than a predetermined value;
   determining, using the controller, a measured value of the current generated by the generator set based on the RMS value and the modified RMS value; and
   adjusting, using the controller, an operation of the generator set when the measured value exceeds an over-current threshold.

2. The method of claim 1, wherein adjusting the operation of the generator set includes at least one of stopping operation of the generator set, tripping a circuit breaker associated with the generator set, or issuing a visual or audible alert.

3. The method of claim 1, wherein the predetermined value is based on the RMS value.

4. The method of claim 1, wherein determining the measured value further includes:
   determining whether the RMS value is greater than a transformer current threshold; and
   when the RMS value is greater than the transformer current threshold, determining, using the controller, a measured value of the current generated by the generator set based on the modified RMS value.

5. The method of claim 4, wherein when the RMS value is less than or equal to the transformer current threshold, determining the measured value of the current generated by the generator set based on the RMS value.

6. The method of claim 4, wherein the transformer current threshold is a first transformer current threshold, and the method further includes:
   comparing the RMS value with a second transformer current threshold greater than the first transformer current threshold; and
   when the RMS value is greater than the first transformer current threshold and less than the second transformer current threshold, determining, using the controller, the measured value based on both the RMS value and the modified RMS value.

7. The method of claim 6, wherein determining the measured value based on both the RMS value and the modified RMS value includes interpolating, using the controller, between the first and second transformer current thresholds using the modified RMS value.

8. The method of claim 6, wherein when the RMS value is greater than or equal to the second transformer current threshold, determining, using the controller, the measured value based on the modified RMS value.

9. The method of claim 8, further including correcting, using the controller, the modified RMS value using a piecewise interpolation scheme.

10. The method of claim 9, wherein correcting the modified RMS value further includes:
    dividing the current range between the second transformer current threshold and a third transformer current threshold into a plurality of segments; and
    determining correction factors for each of the segments.

11. The method of claim 10, further including:
    determining a target segment corresponding to the modified RMS value by comparing the modified RMS value to modified RMS values corresponding to current values bounding at least one of the segments; and
    selecting a correction factor for the determined target segment.

12. The method of claim 11, wherein the correction factor is based on a linear interpolation between current values bounding the target segment.

13. A system for controlling an operation of a generator set, the system including:
    at least one current transformer configured to step down current, generated by the generator set, to a stepped down current;
    a current meter configured to generate a current signal representative of the stepped down current; and
    a controller configured to:
       determine a root-mean-square (RMS) value of a plurality of current values associated with the current signal;
       when the RMS value is greater than a transformer current threshold:
          determine a modified RMS value of current values, selected from the plurality of current values, and that are greater than a predetermined value; and
          determine a measured value of the current generated by the generator set based on the RMS value and the modified RMS value;
       when the RMS value is less than or equal to the transformer current threshold:
          determine the measured value of the current generated by the generator set based on the RMS value; and
       adjust the operation of the generator set when the measured value exceeds an over-current threshold.

14. The system of claim 13, wherein the at least one current transformer includes:
    at least one external current transformer outside the current meter; and
    at least one internal current transformer disposed within the current meter.

15. The system of claim 13, wherein the controller is configured to adjust the operation of the generator set by at least one of stopping operation of the generator set, tripping a circuit breaker, or issuing a visual or audible alert.

16. The system of claim 13, wherein the controller is configured to:
    sample the current values associated with the current signal at a first frequency;
    when the RMS value is greater than the transformer current threshold, sample the current values associated with the current signal at a second frequency greater than the first frequency; and
    determine the modified RMS value based on the current values sampled at the second frequency.

17. The system of claim 13, wherein the predetermined value is based on the RMS value.

18. The system of claim 13, wherein the transformer current threshold is a first transformer current threshold, and the controller is further configured to:
    compare the RMS value with a second transformer current threshold greater than the first transformer current threshold; and
    when the RMS value is greater than the first transformer current threshold and less than the second transformer current threshold, determine the measured value by interpolating between than the first transformer current threshold and the second transformer current threshold.

19. The system of claim 18, wherein the controller is configured to determine a correction factor to correct the modified RMS value when the RMS value is greater than or equal to the second transformer current threshold.

20. The system of claim 19, wherein the controller is configured to determine the correction factor by:
    dividing the current range between the second transformer current threshold and a third transformer current threshold into a plurality of segments;
    determining a target segment corresponding to the RMS value by comparing the modified RMS value to modified RMS values corresponding to current values bounding at least one of the segments; and
    determining, using a look-up table, the correction factor associated with the target segment.

* * * * *